(12) United States Patent
Kanaya

(10) Patent No.: US 10,871,865 B2
(45) Date of Patent: Dec. 22, 2020

(54) DISPLAY DEVICE

(71) Applicant: Japan Display Inc., Minato-ku (JP)

(72) Inventor: Heisuke Kanaya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/779,730

(22) Filed: Feb. 3, 2020

(65) Prior Publication Data

US 2020/0174598 A1 Jun. 4, 2020

Related U.S. Application Data

(63) Continuation of application No. PCT/JP2018/020296, filed on May 28, 2018.

(30) Foreign Application Priority Data

Aug. 9, 2017 (JP) .................................. 2017-154006

(51) Int. Cl.
 *G06F 3/044* (2006.01)
 *G06F 3/041* (2006.01)
 *G01P 1/10* (2006.01)

(52) U.S. Cl.
 CPC ............ *G06F 3/044* (2013.01); *G06F 3/0412* (2013.01); *G01P 1/10* (2013.01)

(58) Field of Classification Search
 CPC .......... G06F 3/0412; G06F 3/044; G01P 1/08; G01P 1/11; B60K 31/185; B60K 2370/143; B60K 2370/1434; B60K 2370/1438; B60K 2370/154
 See application file for complete search history.

(56) References Cited

U.S. PATENT DOCUMENTS

| 4,413,915 | A | * | 11/1983 | Besson | G04G 9/0082 349/113 |
|---|---|---|---|---|---|
| 4,488,818 | A | * | 12/1984 | Saurer | G04G 9/0094 368/242 |
| 6,084,828 | A | * | 7/2000 | Bland | G04G 9/0082 368/223 |
| 6,600,527 | B1 | * | 7/2003 | Basturk | G02F 1/133536 349/115 |
| 7,505,370 | B2 | * | 3/2009 | Rydgren | G04C 17/0091 368/10 |
| 9,959,838 | B2 | * | 5/2018 | Nagata | B60K 35/00 |

(Continued)

FOREIGN PATENT DOCUMENTS

| JP | 2008-139025 A | 6/2008 |
|---|---|---|
| JP | 2010-179885 A | 8/2010 |

OTHER PUBLICATIONS

International Search Report dated Aug. 14, 2018 in PCT/JP2018/020296 filed on May 28, 2018, 2 pages.

(Continued)

*Primary Examiner* — Priyank J Shah
(74) *Attorney, Agent, or Firm* — Oblon, McClelland, Maier & Neustadt, L.L.P.

(57) ABSTRACT

A display device according to an embodiment of the present invention includes: a display panel; a touch sensor located on the display panel; and a pointer made of a conductive material that moves on a region where the touch sensor is provided below the touch sensor; wherein the pointer is electrically connected to a lower electrode of the touch sensor.

5 Claims, 7 Drawing Sheets

(56) References Cited

U.S. PATENT DOCUMENTS

| | | | | |
|---|---|---|---|---|
| 2007/0263374 | A1* | 11/2007 | Luettgen | G01D 11/28 |
| | | | | 362/23.01 |
| 2008/0151700 | A1* | 6/2008 | Inoue | G04C 17/0091 |
| | | | | 368/80 |
| 2015/0078144 | A1* | 3/2015 | Gong | G04G 21/08 |
| | | | | 368/228 |
| 2015/0160621 | A1* | 6/2015 | Yilmaz | G06F 3/0304 |
| | | | | 368/10 |
| 2015/0355771 | A1* | 12/2015 | Watazu | G06F 3/044 |
| | | | | 345/174 |
| 2016/0109861 | A1* | 4/2016 | Kim | G04G 5/00 |
| | | | | 368/69 |
| 2016/0306328 | A1* | 10/2016 | Ko | G04G 21/04 |
| 2019/0123298 | A1* | 4/2019 | Kanaya | H01L 29/78666 |
| 2020/0235194 | A1* | 7/2020 | Ito | G09F 9/30 |

OTHER PUBLICATIONS

English translation of the Written Opinion of the International Searching Authority dated Aug. 14, 2018 in PCT/JP2018/020296, 5 pages.

\* cited by examiner

DISPLAY DEVICE

CROSS-REFERENCE TO RELATED APPLICATION

This application is a continuation of International Application No. PCT/JP2018/020296, filed in the Japan Patent Office on May 28, 2018, the entire contents of which are hereby incorporated by reference. This application claims priority from Japanese application JP2017-154006 filed on Aug. 9, 2017, the entire contents of which are hereby incorporated by reference.

BACKGROUND OF THE INVENTION

1. Field of the Invention

One or more embodiments of the present invention relate to a display device, and particularly to a display device including a pointer that is an analog display and a touch sensor.

2. Description of the Related Art

In recent years, there has been known a device in which a pointer as a structure is provided on a display of a display device as described in JP 2008-139025 A and JP 2010-179885 A.

In addition, a projected capacitive touch sensor changes the capacitance when the user brings his/her finger close to the surface, and measures the ratio of the amount of current due to this change, thereby enabling to accurately determine the position of the touch. For this reason, such a projected capacitive touch sensor is typically used as a touch sensor for portable display devices such as smartphones and tablets.

SUMMARY OF THE INVENTION

However, when the pointer provided for the analog display is made of a conductive material, the capacitance of the display device in which the pointer moves below the projected capacitive touch sensor changes regardless of the user's operation.

An object of the present invention is to provide a display device in which the capacitance of the touch sensor does not change even when the pointer moving below the projected capacitive touch sensor is made of a conductive material.

A display device according to an embodiment of the present invention includes: a display panel; a touch sensor located on the display panel; and a pointer made of a conductive material that moves on a region where the touch sensor is provided below the touch sensor; wherein the pointer is electrically connected to a lower electrode of the touch sensor.

DETAILED DESCRIPTION OF THE INVENTION

Figure 1:
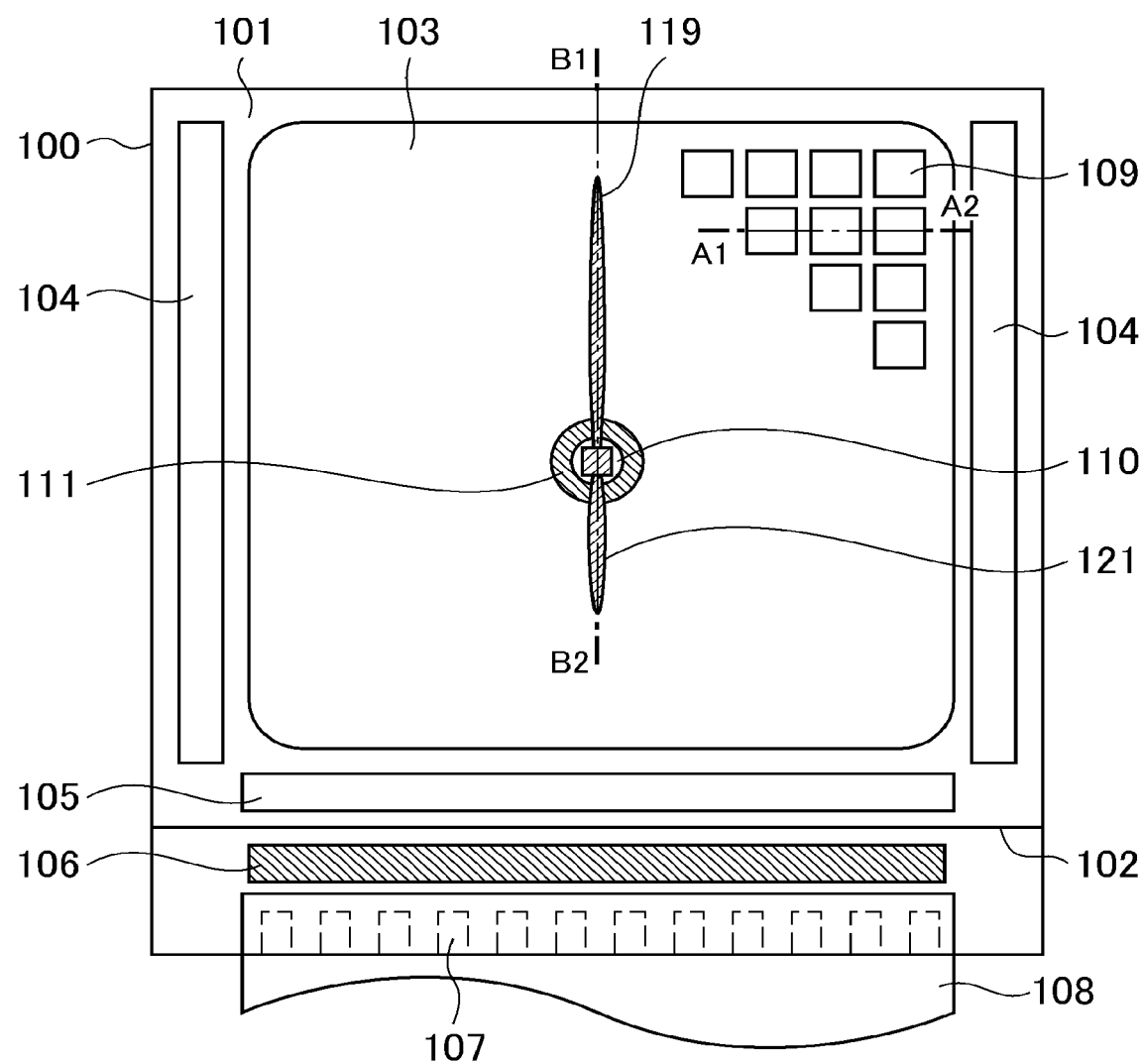
FIG. 1 is a schematic view illustrating a configuration of a display device according to an embodiment of the present invention.

Hereinafter, embodiments of the present invention will be described with reference to the drawings. The disclosure is merely an example, and appropriate modifications which those skilled in the art can easily conceive of while maintaining the gist of the invention are naturally included in the scope of the present invention. In addition, the drawings may be schematically represented with respect to the width, thickness, shape, and the like of each part in comparison with actual aspects for clarity of explanation, but are merely examples and do not limit the interpretation of the present invention. In addition, in the present specification and each drawing, the same elements as those described previously with reference to the previous drawings are denoted by the same reference numerals, and detailed descriptions thereof may be omitted as appropriate.

FIG. 1 is a schematic diagram illustrating a configuration of a display device 100 according to an embodiment of the present invention, and illustrates a schematic configuration when the display device 100 is in plan view. In the present specification, a state in which the display device 100 is viewed from a direction perpendicular to the screen (display area) is referred to as "plan view".

As illustrated in FIG. 1, the display device 100 includes a display area 103, a scanning line driving circuit 104, a data line driving circuit 105, and a driver IC 106, which are formed on a first substrate 101. The driver IC 106 functions as a control unit that provides signals to the scanning line driving circuit 104 and the data line driving circuit 105. The data line driving circuit 105 may be incorporated in the driver IC 106. The driver IC 106 may be disposed on the first substrate 101 in the form of an IC chip, or may be provided externally by being provided in a flexible print circuit (FPC) circuit 108. The FPC circuit 108 is connected to a terminal 107 provided on the first substrate 101. Further, a counter substrate 102 to be described later is disposed to face the first substrate 101. The first substrate 101 and components filmed and bonded to the main surface of the first substrate 101 are also collectively referred to as a display panel 137.

Here, the first substrate 101 is made of an insulating material, and supports each layer such as a pixel electrode 125 and an insulating layer 126 provided on a front surface of the first substrate 101. An insulating film (base film 113) that is in direct contact with the front surface may be formed on the front surface of the first substrate 101. The material of the first substrate 101 and the material for forming the insulating film are not particularly limited.

A plurality of pixels 109 are arranged in a matrix in the display area 103 illustrated in FIG. 1. Each pixel 109 includes the pixel electrode 125 described later; and a light emitting element including a part of the pixel electrode 125 (anode), an organic layer 127 (light emitting portion) including a light emitting layer stacked on the pixel electrode 125, and a cathode. Each pixel 109 is supplied with a data signal corresponding to image data from the data line driving circuit 105. In accordance with these data signals, a transistor electrically connected to the pixel electrode 125 provided in each pixel 109 can be driven to perform screen display according to image data. As the transistor, a thin film transistor (TFT) can be typically used, but any element having a current control function may be used.

Figure 2:
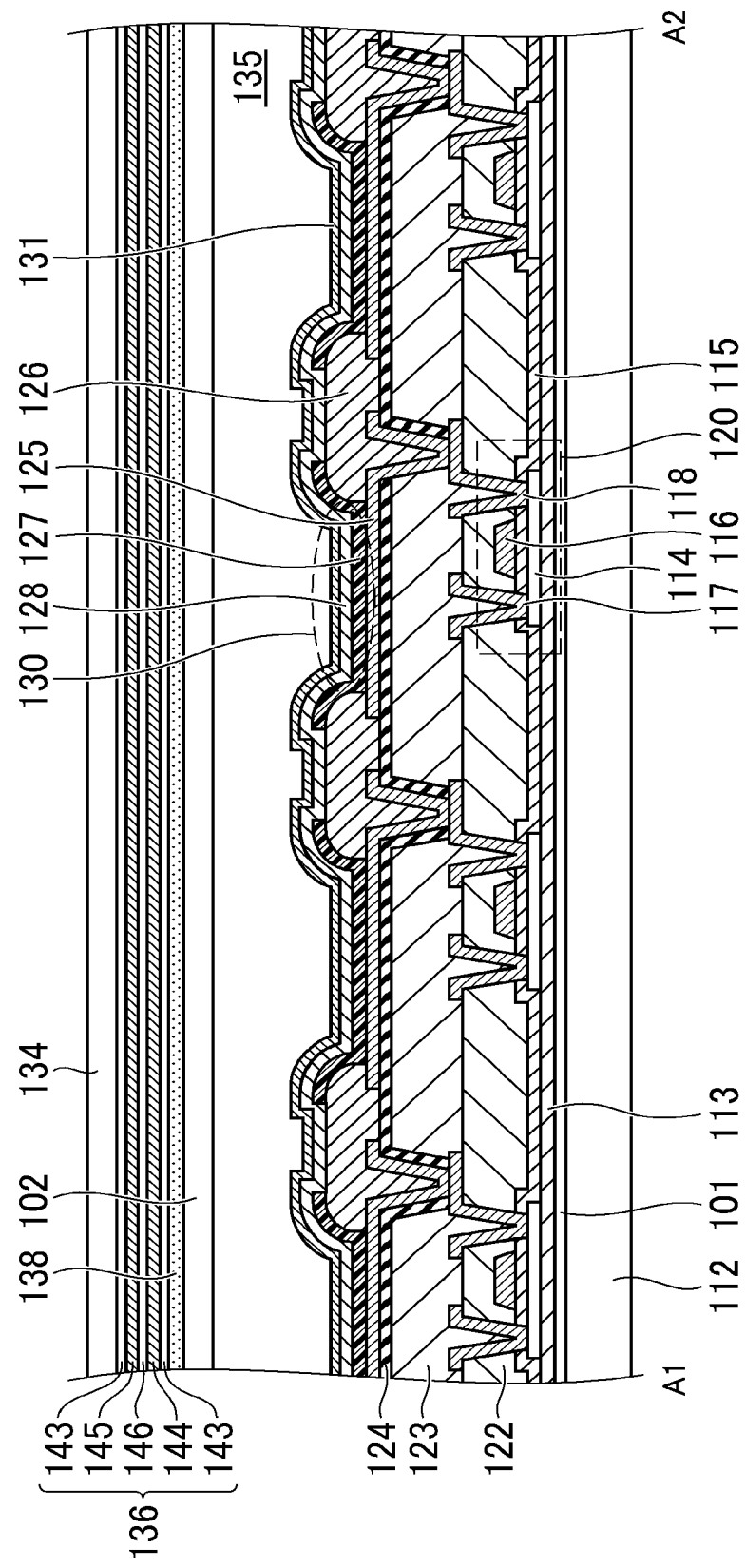
FIG. 2 is a cross-sectional view taken along line A1-A2 in FIG. 1.

FIG. 2 is a diagram illustrating an example of a pixel configuration in the display device 100 according to a first embodiment. Specifically, FIG. 2 is a diagram illustrating a cross-sectional configuration of the display area 103 illustrated in FIG. 1 cut along A1-A2. FIG. 2 illustrates a cross section of three light emitting elements 130 as a part of the display region 103. In FIG. 2, three light emitting elements 130 are illustrated, but in reality, in the display region 103, several million or more light emitting elements are arranged in a matrix corresponding to the pixels.

As illustrated in FIG. 2, the display device 100 includes the first substrate 101, a second substrate 112, and the counter substrate 102. A glass substrate, a quartz substrate, or a flexible substrate (polyimide, polyethylene terephthalate, polyethylene naphthalate, or other flexible resin substrate) can be used as the first substrate 101, the second substrate 112, and the counter substrate 102. When the first substrate 101 and the second substrate 112 do not need to have a light-transmitting property, a metal substrate, a ceramic substrate, or a semiconductor substrate can be used. In the present embodiment, a case where polyimide is used as the first substrate 101 and polyethylene terephthalate is used as the second substrate 112 and the counter substrate 102 will be described. Since the second substrate 112 is provided on the back surface of the first substrate 101 (the surface opposite to the side where the terminal 107 is located), the second substrate 112 is also referred to as a protective film or a protective resin film.

The base film 113 is provided on the first substrate 101. The base film 113 is an insulating layer made of an inorganic material such as silicon oxide, silicon nitride, or aluminum oxide. The base film 113 is not limited to a single layer, and may have, for example, a stacked structure in which a silicon oxide layer and a silicon nitride layer are combined. This configuration may be determined as appropriate in consideration of adhesion to the first substrate 101 and the gas barrier property with respect to a transistor 120 to be described later.

The transistor 120 is provided on the base film 113. The structure of the transistor 120 may be a top gate type or a bottom gate type. In the present embodiment, the transistor 120 includes a semiconductor layer 114 provided on the base film 113, a gate insulating film 115 covering the semiconductor layer 114, and a gate electrode 116 provided on the gate insulating film 115. Further, on the transistor 120, an interlayer insulating film 122 covering the gate electrode 116; and a source or drain electrode 117 and a source or drain electrode 118 which are provided on the interlayer insulating film 122 and respectively connected to the semiconductor layer 114 are provided. In the present embodiment, an example in which the interlayer insulating film 122 has a single layer structure is described, but the interlayer insulating film 122 may have a stacked structure.

The material of each layer constituting the transistor 120 may be a known material and is not particularly limited. For example, as the semiconductor layer 114, polysilicon, amorphous silicon, or an oxide semiconductor can be generally used. As the gate insulating film 115, silicon oxide or silicon nitride can be used. The gate electrode 116 is made of a metal material such as copper, molybdenum, tantalum, tungsten, or aluminum. As the interlayer insulating film 122, silicon oxide or silicon nitride can be used. The source or drain electrode 117 and the source or drain electrode 118 are each made of a metal material such as copper, titanium, molybdenum, or aluminum.

Although not illustrated in FIG. 2, a first wiring made of the same metal material as that constituting the gate electrode 116 can be provided in the same layer as the gate electrode 116. The first wiring can be provided as a scanning line driven by the scanning line driving circuit 104, for example. Although not illustrated in FIG. 2, a second wiring extending in a direction intersecting with the first wiring can be provided in the same layer as the source or drain electrode 117 and the source or drain electrode 118. The second wiring can be provided as a data line driven by the data line driving circuit 105, for example.

A planarization film 123 is provided on the transistor 120. The planarization film 123 includes an organic resin material. As the organic resin material, for example, a known organic resin material such as polyimide, polyamide, acrylic, or epoxy can be used. These materials have a feature that a film can be formed by a solution coating method and a flattening effect is high. Although not particularly illustrated, the planarization film 123 is not limited to a single layer structure, and may have a stacked structure of a layer containing an organic resin material and an inorganic insulating layer.

The planarization film 123 has a contact hole that exposes a part of the source or drain electrode 118. The contact hole is an opening for electrically connecting the pixel electrode 125 described later and the source or drain electrode 118. Therefore, the contact hole is provided so as to overlap with a part of the source or drain electrode 118. At the bottom surface of the contact hole, the source or drain electrode 118 is exposed.

A protective film 124 is provided on the planarization film 123. The protective film 124 has a contact hole that overlaps with the contact hole formed in the planarization film 123 and exposes a part of the source or drain electrode 118 in the contact hole. The protective film 124 is preferably an inorganic insulating material and a material having a barrier function against moisture and oxygen, and is formed using, for example, a silicon nitride film.

The pixel electrode 125 is provided on the protective film 124. The pixel electrode 125 overlaps with the contact hole included in the planarization film 123 and the protective film 124 and is electrically connected to the source or drain electrode 118 exposed at the bottom surface of the contact hole. In the display device 100 of the present embodiment, the pixel electrode 125 functions as an anode constituting the light emitting element 130. The pixel electrode 125 is configured differently depending on whether the pixel electrode 125 is a top emission type or a bottom emission type. For example, in the case of the top emission type, a highly reflective metal film (for example, silver) is used as the pixel electrode 125, or a stacked structure of a transparent conductive film having a high work function, such as an indium oxide-based transparent conductive film (for example, ITO) or a zinc oxide-based transparent conductive film (for example, IZO or ZnO), and a metal film is used. Conversely, in the case of the bottom emission type, the above-described transparent conductive film is used as the pixel electrode 125. In the present embodiment, a top emission type organic EL display device will be described as an example. An end portion of the pixel electrode 125 is covered with a first insulating layer 126 described later.

The first insulating layer 126 made of, for example, an organic resin material is provided on the pixel electrode 125. As the organic resin material, a known resin material such as polyimide, polyamide, acrylic, epoxy, or siloxane can be used. The first insulating layer 126 has an opening in a part on the pixel electrode 125. The first insulating layer 126 is provided between the pixel electrodes 125 adjacent to each other so as to cover an end portion (edge portion) of the pixel electrode 125, and functions as a member that separates the adjacent pixel electrodes 125. That is, the first insulating layer 126 is divided into a plurality of pixels 109. For this reason, the first insulating layer 126 is generally also called a "partition wall" or a "bank". A part of the pixel electrode 125 exposed from the first insulating layer 126 becomes a light emitting region of the light emitting element 130. Preferably, the opening of the first insulating layer 126 has a tapered inner wall. Accordingly, it is possible to reduce a coverage defect in the end portion of the pixel electrode 125 when a light emitting layer described later is formed. The first insulating layer 126 may not only cover the end portion of the pixel electrode 125 but also function as a filler that fills a recess caused by the contact hole of the planarization film 123 and the protective film 124.

The organic layer 127 is provided on the pixel electrode 125. The organic layer 127 has a light emitting layer made of at least an organic material and functions as a light emitting portion of the light emitting element 130. In addition to the light emitting layer, the organic layer 127 may include various layers such as an electron injection layer, an electron transport layer, a hole injection layer, and a hole transport layer. The organic layer 127 is provided to cover the light emitting region, that is, to cover the opening of the first insulating layer 126 in the light emitting region and the end portion of the first insulating layer 126.

It is assumed that the present embodiment has a configuration in which each color of RGB is displayed by providing a light emitting layer that emits light of a desired color in the organic layer 127 and forming the organic layer 127 having a different light emitting layer on each pixel electrode 125. That is, in the present embodiment, the organic layer 127 is discontinuous between adjacent pixels 109, in other words, between adjacent pixel electrodes 125. A known structure or a known material can be used for the organic layer 127, and the organic layer 127 is not particularly limited to the configuration of the present embodiment. Further, the organic layer 127 may include a light emitting layer that emits white light, and may display each color of RGB through a color filter. In this case, the organic layer 127 may cover the first insulating layer 126 and be provided across the plurality of pixels 109.

A counter electrode 128 is provided on the organic layer 127 and the first insulating layer 126. The counter electrode 128 functions as a cathode constituting the light emitting element 130. Since the display device 100 of the present embodiment is a top emission type, a transparent electrode is used as the counter electrode 128. As a thin film constituting the transparent electrode, a MgAg thin film or a transparent conductive film (ITO or IZO) is used. The counter electrode 128 is also provided on the first insulating layer 126 across the pixels 109. The counter electrode 128 is electrically connected to an external terminal via a lower conductive layer in the peripheral region outside the display region 103 and in the vicinity of the end portion of the display region 103. As described above, in the present embodiment, the light emitting element 130 is configured by a part of the pixel electrode 125 (anode) exposed from the first insulating layer 126, the organic layer 127 (light emitting portion), and the counter electrode 128 (cathode).

A first inorganic insulating layer 131 is provided on the counter electrode 128. The first inorganic insulating layer 131 covers the plurality of light emitting elements 130 and protects the light emitting elements 130 from external moisture, outside air, and the like. Therefore, the first inorganic insulating layer 131 is also referred to as a sealing film. As the first inorganic insulating layer 131, a dense inorganic insulating film such as a silicon nitride film is preferably used. The sealing film may have a stacked structure of an inorganic insulating film and an organic insulating film.

All components from the above-described second substrate 112 to the first inorganic insulating layer 131 (sealing film) are collectively referred to as an array substrate in the present embodiment.

On the array substrate, the counter substrate 102 is provided through a filler 135 (also referred to as a filling material) that functions as an adhesive and a protective material. As the filler 135, a known resin material such as polyimide, polyamide, acrylic, epoxy, or siloxane can be used. In particular, if the counter substrate 102 is a resin substrate (resin film), a known light-transmitting adhesive is used for the filler 135. The filler 135 may be provided with a spacer in order to secure a gap between the array substrate and the counter substrate 102. Such a spacer may be mixed with the filler 135 or may be formed on the array substrate with a resin or the like. In addition, a structure without the filler 135 may be used as long as sufficient sealing can be performed at the substrate peripheral portion of the array substrate and the counter substrate 102 and bonding and gap maintenance between the array substrate and the counter substrate 102 can be realized. In a structure in which the filler 135 is not used, an annular substrate bonding member (also referred to as a sealing material) may be disposed in the substrate peripheral portion of the array substrate and the counter substrate 102. For example, an organic resin or frit glass is used as the substrate bonding member. Further, in a structure in which the filler 135 is not used, a portion where the filler 135 is located in FIG. 2 may be filled with an inert gas (for example, nitrogen).

The counter substrate 102 may be provided with, for example, an overcoat layer for planarization. When the organic layer 127 emits white light, the counter substrate 102 may be provided with a color filter corresponding to each color of RGB on the main surface thereof (surface facing the first substrate 101), and a black matrix provided between the color filters. The counter substrate 102 is not an essential element of the display device 100, and the counter substrate 102 can be omitted if the filler 135 has a sufficient film thickness and strength, and the layers below the sealing film can be suitably protected from the contact of foreign substances from the outside, or the like. When the counter substrate 102 is omitted and a color filter is necessary, for example, the color filter may be formed directly on the sealing film or the like and the filler 135 may be formed thereon. Also, a polarizing plate 138 is provided on the back surface (display surface side) of the counter substrate 102. The polarizing plate 138 is, for example, a circular polarizing plate. The counter substrate 102 may be omitted, and a circular polarizing plate may be attached to the array substrate via an adhesive. In other words, the counter substrate 102 may be a circular polarizing plate.

A touch sensor 136 is provided above the counter substrate 102. The touch sensor 136 is a projected capacitive touch sensor. Further, a cover glass 134 which is a part of a housing 129 of the display device 100 is provided on the touch sensor 136.

Figure 3:
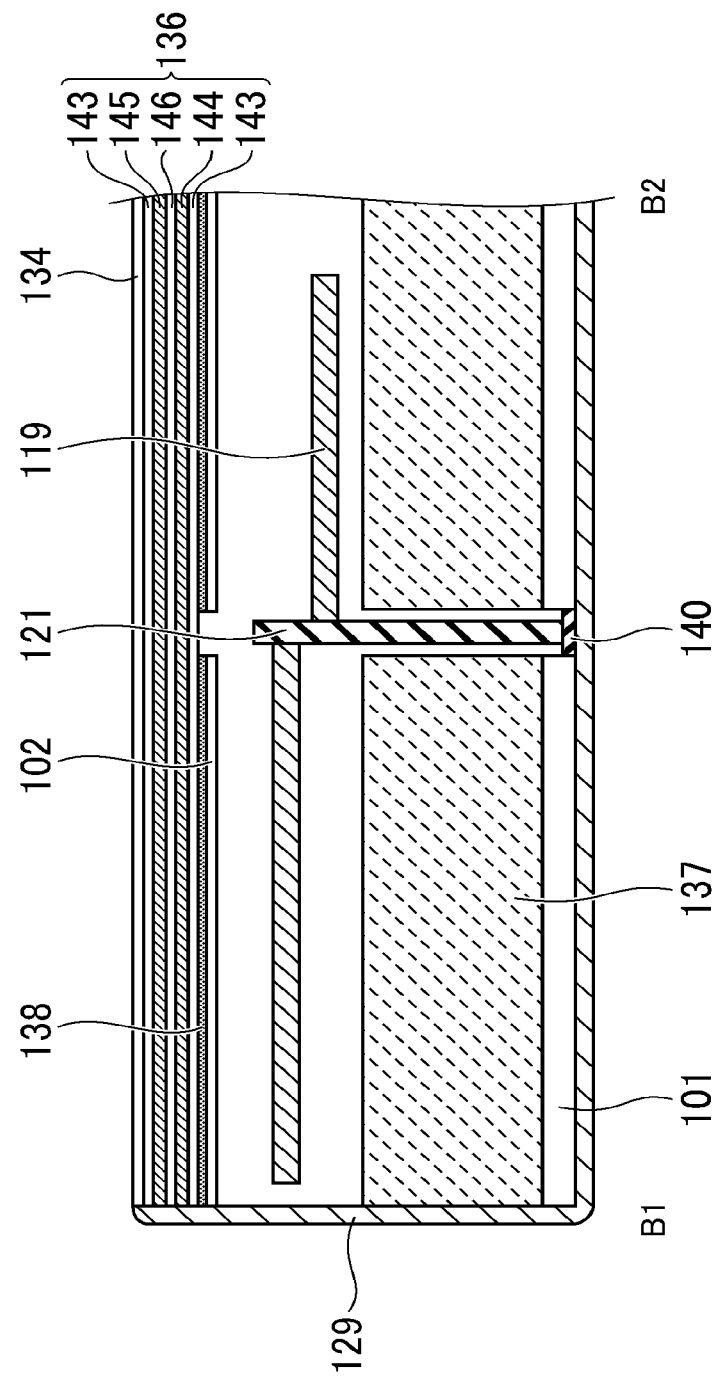
FIG. 3 is a cross-sectional view taken along line B1-B2 in FIG. 1.

FIG. 3 is a diagram illustrating an example of the arrangement of structures in the display device 100 according to the first embodiment. Specifically, FIG. 3 is a diagram illustrating a cross-sectional configuration of the display area 103 illustrated in FIG. 1 cut along B1-B2. A stacked structure on the first substrate 101 is illustrated as a display panel 137.

A shaft 121 for providing a pointer 119 is disposed in a through-hole 110. The pointer 119 is made of any conductive material, and is made of, for example, a metal or a conductive resin. Since the shaft 121 also needs to be conducted to the pointer 119, the shaft 121 is made of a conductive material, for example, a metal or a conductive resin. The counter substrate 102, the polarizing plate 138, and the touch sensor 136 are provided between the pointer 119 and the cover glass 134 that is a part of the housing 129.

As illustrated in FIG. 3, the touch sensor 136 has a structure in which a lower electrode 144 and an upper electrode 145 bonded by an adhesion layer 146 are sandwiched from above and below by a glass substrate 143. When the housing 129 of the display device 100 is made of a conductive material such as metal, the lower electrode 144 of the touch sensor 136 and a bearing portion 140 of the shaft 121 are conducted by the housing 129. On the other hand, when the housing 129 of the display device 100 is made of an insulating material, a conductive wire is provided for conducting the end portion of the lower electrode 144 of the touch sensor 136 to the bearing portion 140 of the shaft 121. Specifically, one end of the conductive wire is welded to the terminal portion of the lower electrode 144 of the touch sensor 136, and the other end of the conductive wire is welded to the bearing portion 140 of the shaft 121. Further, the housing 129 or the conductive wire may be grounded.

Thus, the lower electrode 144 of the touch sensor 136 is ensured to be conducted to the bearing portion 140 of the shaft 121 having the pointer 119 via the housing 129 or the conductive wire.

Even when the pointer 119 is made of an insulating material, if a dielectric breakdown is assumed between the pointer 119 and the touch sensor 136, the pointer 119 and the touch sensor 136 may be conducted via the shaft 121 and the bearing portion 140 as described above.

Figure 4:
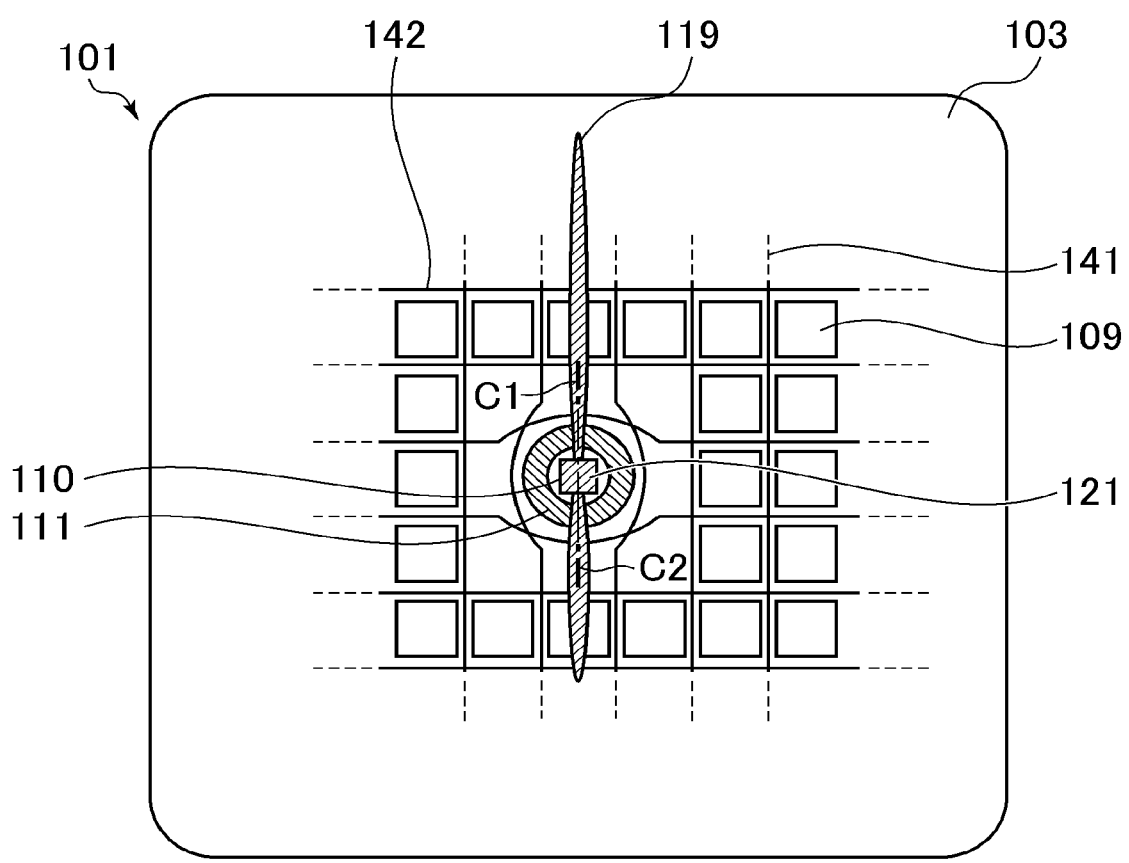
FIG. 4 is a cross-sectional view illustrating a display area of a display device according to an embodiment of the present invention.

FIG. 4 illustrates a configuration in which the through-hole 110 penetrating the array substrate and the counter substrate 102 is provided in the display area 103 of the display device 100. FIG. 4 illustrates the plurality of pixels 109, the through-hole 110, and a moisture blocking region 111.

As illustrated in FIG. 4, the display area 103 includes the plurality of pixels 109, a plurality of scanning lines 141, a plurality of data lines 142, the through-hole 110, and the moisture blocking region 111 (also referred to as a region surrounding the through-hole 110). The scan line 141 is electrically connected to a pixel circuit included in the pixel 109. Further, the data line 142 intersects with the scanning line 141 and is electrically connected to the pixel circuit included in the pixel 109.

Further, as illustrated in FIG. 4, the scanning line 141 bypasses the through-hole 110 and the moisture blocking region 111 and is connected to the pixel circuit provided in each of the pixels 109 on both sides facing the through-hole 110. The data line 142 also bypasses the through-hole 110 and the moisture blocking region 111 and is connected to the pixel circuit provided in each of the upper and lower pixels 109 facing the through-hole 110. As a result, even when the display region 103 is provided with the through-hole 110 that penetrates the array substrate and the counter substrate, an image signal can be normally output. In FIG. 4, the configuration in which the scanning line 141 and the data line 142 do not overlap with the moisture blocking region 111 is illustrated, but the present invention is not limited thereto. The scanning line 141 and the data line 142 may overlap with the moisture blocking region 111. Further, in the display area 103 illustrated in FIG. 4, an example in which one through-hole 110 is provided is shown, a configuration in which a plurality of through-holes 110 are provided may be employed. Moreover, when the plurality of through-holes 110 are provided, the size of each through-hole 110 may be different. Moreover, although the example in which the through-hole 110 and the moisture blocking region 111 have a circular shape is illustrated, the through-hole 110 and the moisture blocking region 111 may have a polygonal shape.

Figure 5:
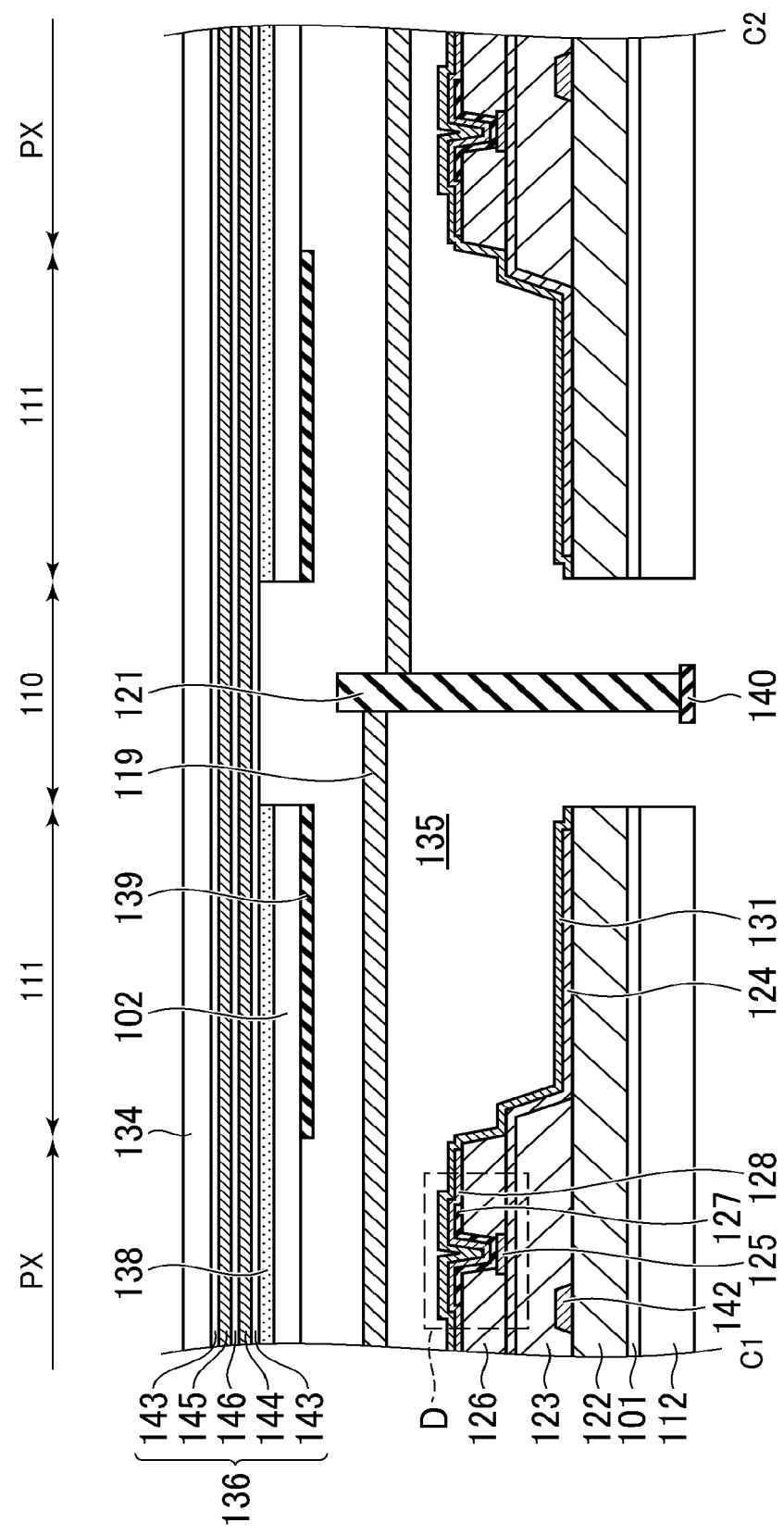
FIG. 5 is an example of a cross-sectional view taken along line C1-C2 in FIG. 4.

FIG. 5 is a cross-sectional view taken along line C1-C2 illustrated in FIG. 4. In the cross-sectional view of FIG. 5, the width of the through-hole 110 is illustrated to be narrower than the width of the moisture blocking region 111 for the sake of explanation. However, in reality, the width of the through-hole 110 is wider than the width of the moisture blocking region 111.

In FIG. 5, the data line 142 bypassing the through-hole 110 is arranged on the interlayer insulating film 122. For example, the data line 142 is formed of the same layer as the source or drain electrodes 117 and 118 illustrated in FIG. 2. The planarization film 123 is provided on the interlayer insulating film 122. In a region PX where the pixel 109 is formed, the protective film 124 is provided on the planarization film 123. In the moisture blocking region 111, the protective film 124 is provided in contact with the end portion of the planarization film 123, in other words, in contact with the upper surface and the side surface of the planarization film 123. The protective film 124 preferably has a barrier function against moisture.

As described above, the pixel electrode 125, the first insulating layer 126, the organic layer 127, and the counter electrode 128 are provided in the region PX where the pixel 109 is formed. The pixel electrode 125, the organic layer 127, and the counter electrode 128 constitute the light emitting element 130. The first inorganic insulating layer 131 is provided on the light emitting element 130. Further, the first inorganic insulating layer 131 is provided in contact with the protective film 124 on the interlayer insulating film 122. The first inorganic insulating layer 131 is provided in contact with the end portion of the protective film 124. The first inorganic insulating layer 131 functions as a sealing film for the light emitting element 130.

A dummy pixel D may be disposed between the pixel 109 and the through-hole 110. The dummy pixel D illustrated in FIG. 5 includes the pixel electrode 125, the organic layer 127, and the counter electrode 128. The dummy pixel D does not necessarily have a function of emitting light, and need not have the same structure as the pixel 109 and the light emitting element 130. By providing the dummy pixel D between the pixel 109 and the through-hole 110, for example, in the manufacturing process after the through-hole 110 is provided, an effect of preventing the pixel circuit included in the pixel 109 from being destroyed by static electricity entering from the side surface of the through-hole 110, that is, the end surface of the array substrate exposed by the through-hole 110 can be obtained.

The array substrate having the above structure and the counter substrate 102 are attached to each other with the filler 135 interposed therebetween. The counter substrate 102 may be provided with a light shielding layer 139 on the side facing the light emitting element 130 in the moisture blocking region 111 as illustrated in FIG. 5. The polarizing plate 138 is provided on the display surface side of the counter substrate 102, and the touch sensor 136 and the cover glass 134 are provided on the display surface side of the polarizing plate 138.

Figure 6:
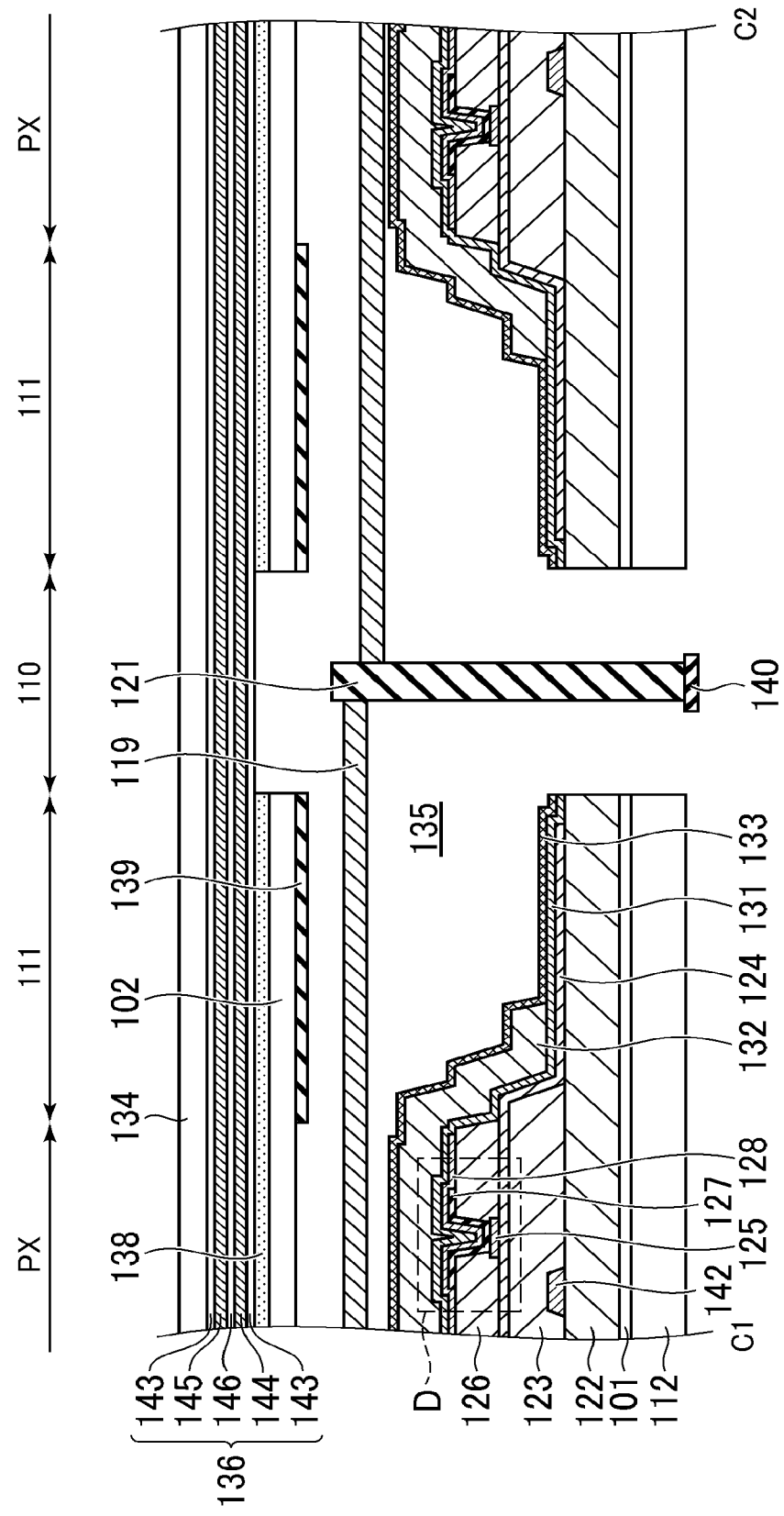
FIG. 6 is an example of a cross-sectional view taken along line C1-C2 in FIG. 4.

The through-hole 110 is a hole that penetrates the array substrate and the counter substrate 102. As illustrated in FIGS. 3, 5, and 6, the polarizing plate 138 also has an opening at a position where the through-hole 110 is provided. The touch sensor 136 and the cover glass 134 do not have openings.

As illustrated in FIG. 5, a structure for analog display, for example, the shaft 121 and the bearing portion 140 for installing the pointer 119 are provided in a region of the provided through-hole 110, and further, the pointer 119 and the lower electrode 144 of the touch sensor 136 are made to be conducted. Therefore, the capacitance of the touch sensor 136 does not change even when the metal pointer 119 moves. Therefore, a display in which an analog display is combined with a digital display provided with control by a touch sensor is possible, and a display device with improved design can be provided.

Further, when the moisture blocking region 111 is provided in the display region 103 so as to surround the through-hole 110 penetrating the array substrate and the counter substrate 102, the end portion of the planarization film 123 and the end portion of the first insulating layer 126, which can serve as an intrusion route of moisture and oxygen, can be sealed with the protective film 124 having a barrier function against moisture and oxygen. In addition, the first inorganic insulating layer 131 (sealing film) having a barrier function against moisture and oxygen is provided on the light emitting element 130. The first inorganic insulating layer 131 extends to the moisture blocking region 111, and in the moisture blocking region 111, the protective film 124 and the first inorganic insulating layer 131 are in contact with each other, and thus, the intrusion of moisture and oxygen from the through-hole 110 can be prevented. In other words, in the moisture blocking region 111, that is, the region between the through-hole 110 and the pixel 109, a layer made of an organic material is not arranged in the stacked structure in which various layers formed on the first substrate 101 are stacked, and thus, the intrusion of moisture and oxygen from the through-hole 110 can be prevented. Accordingly, deterioration of the light emitting element can be prevented, and thus, the reliability of the display device can be improved.

FIG. 6 illustrates an example of a display device that is partially different from FIG. 5. In the display device illustrated in FIG. 6, the configuration of the sealing film provided on the light emitting element 130 is partially different from the configuration of the sealing film provided on the light emitting element 130 illustrated in FIG. 5. Since other configurations are the same as those of the display device illustrated in FIG. 5, the detailed descriptions thereof are omitted.

As illustrated in FIG. 6, the first inorganic insulating layer 131, an organic insulating layer 132, and a second inorganic insulating layer 133 are provided on the light emitting element 130. The first inorganic insulating layer 131, the organic insulating layer 132 and the second inorganic insulating layer 133 function as a sealing film for the light emitting element 130. By providing a sealing film on the light-emitting element 130, moisture and oxygen can be prevented from entering the light-emitting element 130. Therefore, the light-emitting element 130 can be prevented from being deteriorated by moisture and oxygen. The organic insulating layer 132 includes an organic resin material. As the organic resin material, for example, a known organic resin material such as polyimide, polyamide, acrylic, or epoxy can be used. The second inorganic insulating layer 133 is preferably a highly dense film that can prevent the intrusion of moisture and oxygen. For example, a silicon nitride film is preferably used as the second inorganic insulating layer 133.

As illustrated in FIG. 6, the organic insulating layer 132 is provided so as to cover the end portion of the first insulating layer 126 and the end portion of the planarization film 123 through the first inorganic insulating layer 131. The second inorganic insulating layer 133 is provided so as to cover the upper surface and the end portion of the organic insulating layer 132, and is provided so as to be in contact with the first inorganic insulating layer 131.

As illustrated in FIG. 6, a structure for analog display, for example, the shaft 121 and the bearing portion 140 for installing the pointer 119 are provided in the region of the provided through-hole 110, and further, the pointer 119 and the lower electrode 144 of the touch sensor 136 are made to be conducted. Therefore, the capacitance of the touch sensor 136 does not change even when the metal pointer 119 moves. Therefore, a display in which an analog display is combined with a digital display provided with control by a touch sensor is possible, and a display device with improved design can be provided.

In addition, by providing the first inorganic insulating layer 131, the organic insulating layer 132, and the second inorganic insulating layer 133 as a sealing film on the light emitting element 130, moisture and oxygen can be further prevented from entering the light emitting element 130. Further, in the moisture blocking region 111, the protective film 124 and the first inorganic insulating layer 131 are in contact with each other, and the first inorganic insulating layer 131 and the second inorganic insulating layer 133 are in contact with each other, and thus, moisture and oxygen can be prevented from entering the light emitting element 130. In particular, in the end portion of the through-hole 110 (region in contact with the end portion of the through-hole 110 in the moisture blocking region 111), a structure in which the first inorganic insulating layer 131 and the second inorganic insulating layer 133 are directly connected to each other without passing through an organic layer (for example, the organic insulating layer 132) has a remarkable effect of blocking moisture intrusion from the through-hole 110 to the inside of the display device 100.

Figure 7:
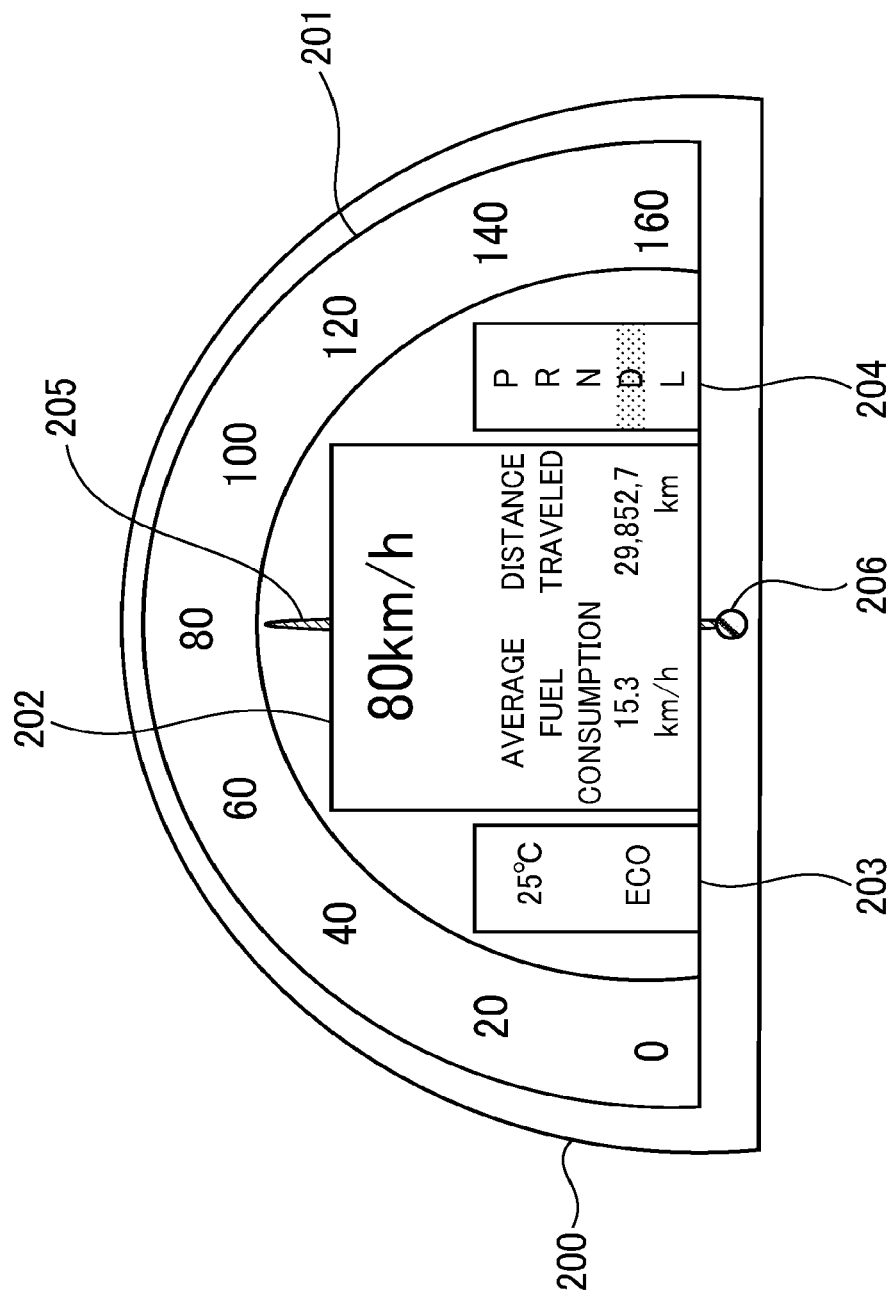
FIG. 7 is a schematic view illustrating a configuration of a display device according to an embodiment of the present invention.

FIG. 7 is a schematic diagram illustrating a configuration of a display device 200 according to an embodiment of the present invention, and illustrates a schematic configuration in plan view of the display device 200. The display device 200 includes a speed display area 201, display areas 202, 203, and 204, a pointer 205, and a shaft 206 for installing the pointer 205. The pointer 205 is made of any conductive material, and is made of, for example, a metal or a conductive resin. The shaft 206 also needs to be conducted to the pointer 205 and thus, is made of a conductive material, for example, a metal or a conductive resin.

As illustrated in FIG. 7, the pointer 205 moves below display areas 202, 203, and 204 that include touch sensors. Thus, the lower electrode of the touch sensor is conducted to the shaft 206 and the pointer 205 via a conductive wire. Further, the conductive wire may be grounded.

As a result, since the lower electrode of the touch sensor is ensured to be conducted to the bearing portion of the shaft having the pointer through the conductive wire, the capacitance of a touch sensor 213 does not change even when the metal pointer 205 moves. A display in which an analog display is combined with a digital display provided with control by a touch sensor is possible, and a speedometer with improved design can be provided.

Based on the display device described as embodiments and examples of the present invention, those in which addition, deletion or change in the design of the components has been appropriately made by those skilled in the art, or those in which processes have been added, omitted or changed in conditions are included in the scope of the present invention as long as they have the gist of the present invention. Further, the above-described embodiments can be combined with each other as long as no technical contradiction occurs.

Of course, it is understood that although operational effects are different from the operational effects provided by the above-described embodiments, those that are obvious from the description of the present specification or can be easily predicted by those skilled in the art are provided by the present invention.

What is claimed is:

1. A display device comprising:
   a display panel;
   a touch sensor located on the display panel; and
   a pointer including a conductive material that moves on a region where the touch sensor is provided below the touch sensor; wherein
   the pointer is electrically connected to a lower electrode of the touch sensor.

2. The display device according to claim 1, wherein the lower electrode of the touch sensor is connected to the pointer through a housing or a conductive wire.

3. The display device according to claim 1, wherein the lower electrode of the touch sensor is connected to a ground potential.

4. The display device according to claim 1, wherein the display panel comprises:
   a substrate,
   a plurality of pixels located on the substrate and having a light emitting element;
   a display area in which the plurality of pixels are arranged;
   a thin film transistor included in each of the plurality of pixels;
   a protective film located between the thin film transistor and the light emitting element, and made of an inorganic insulating material; and
   a sealing film covering the light emitting element and including an inorganic insulating material, and
   the inorganic insulating material included in the sealing film is in contact with the protective film in a first region between the plurality of pixels and a through-hole.

5. The display device according to claim 1, wherein the display panel comprises:
   a substrate,
   a plurality of pixels located on the substrate and having a light emitting element;
   a display area in which the plurality of pixels are arranged; and
   a sealing film that covers the light emitting element and includes a first inorganic insulating layer, an organic insulating layer, and a second inorganic insulating layer stacked from the light emitting element side, and
   the first inorganic insulating layer is in contact with the second inorganic insulating layer in a first region between the plurality of pixels and a through-hole.

* * * * *